US009934958B2

(12) United States Patent
Sato et al.

(10) Patent No.: US 9,934,958 B2
(45) Date of Patent: Apr. 3, 2018

(54) SUBSTRATE TREATMENT APPARATUS AND SUBSTRATE TREATMENT METHOD

(71) Applicant: TOSHIBA MEMORY CORPORATION, Minato-ku (JP)

(72) Inventors: Katsuhiro Sato, Yokkaichi (JP); Junichi Igarashi, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 324 days.

(21) Appl. No.: 14/644,772

(22) Filed: Mar. 11, 2015

(65) Prior Publication Data

US 2016/0141170 A1 May 19, 2016

(30) Foreign Application Priority Data

Nov. 17, 2014 (JP) .................................. 2014-232989

(51) Int. Cl.
*H01L 21/02* (2006.01)
*H01L 21/67* (2006.01)

(52) U.S. Cl.
CPC .. *H01L 21/02057* (2013.01); *H01L 21/67028* (2013.01); *H01L 21/67253* (2013.01)

(58) Field of Classification Search
CPC ......... H01L 21/67028; H01L 21/02057; H01L 21/67253
See application file for complete search history.

(56) References Cited

U.S. PATENT DOCUMENTS

| 5,499,733 A | * | 3/1996 | Litvak | B24B 37/013 |
| | | | | 216/38 |
| 6,280,793 B1 | * | 8/2001 | Atwell | C23C 16/4486 |
| | | | | 118/726 |
| 2003/0072875 A1 | * | 4/2003 | Sandhu | C23C 16/4481 |
| | | | | 427/248.1 |
| 2003/0158613 A1 | * | 8/2003 | Chen | C21B 5/003 |
| | | | | 700/94 |
| 2005/0011448 A1 | * | 1/2005 | Iwata | C23C 16/52 |
| | | | | 118/715 |

(Continued)

FOREIGN PATENT DOCUMENTS

| JP | 2007-027697 A | 2/2007 |
| JP | 2008-10638 A | 1/2008 |

(Continued)

OTHER PUBLICATIONS

U.S. Appl. No. 14/632,302, filed Feb. 26, 2015, Sato et al.

*Primary Examiner* — Michael Barr
*Assistant Examiner* — Benjamin L Osterhout
(74) *Attorney, Agent, or Firm* — Oblon, McClelland, Maier & Neustadt, L.L.P.

(57) ABSTRACT

The substrate treatment apparatus includes a first nozzle, a second nozzle, a detector, and a controller. The first nozzle supplies an organic sublimable material-containing liquid capable of displacing a rinsing liquid, to a surface of a substrate treated with the rinsing liquid. The second nozzle supplies vapor of a solvent in which the organic sublimable material is capable of dissolving, to the surface of the substrate. The detector detects a first physical amount of the vapor on the surface of the substrate. The controller controls a second physical amount of the vapor according to the first physical amount.

14 Claims, 7 Drawing Sheets

(56) References Cited

U.S. PATENT DOCUMENTS

| | | | |
|---|---|---|---|
| 2006/0285108 A1* | 12/2006 | Morrisroe | F23C 99/003 356/316 |
| 2007/0004170 A1 | 1/2007 | Kawasaki et al. | |
| 2007/0163713 A1* | 7/2007 | Kasai | C23C 16/4481 156/345.3 |
| 2009/0032067 A1* | 2/2009 | Kojimaru | H01L 21/67034 134/26 |
| 2010/0248474 A1 | 9/2010 | Sato | |
| 2010/0325913 A1* | 12/2010 | Wang | F26B 5/12 34/423 |
| 2011/0155181 A1* | 6/2011 | Inatomi | H01L 21/02052 134/30 |
| 2012/0016508 A1* | 1/2012 | Matsuzaki | H01J 37/32449 700/108 |
| 2012/0073599 A1 | 3/2012 | Miya et al. | |
| 2012/0204576 A1* | 8/2012 | Matsuzaki | H01L 21/67017 62/3.1 |
| 2013/0008868 A1 | 1/2013 | Uozumi et al. | |
| 2013/0074764 A1 | 3/2013 | Ishihara et al. | |
| 2014/0290575 A1* | 10/2014 | Hirose | C23C 16/52 118/696 |
| 2014/0345523 A1* | 11/2014 | Kikuchi | C23C 16/45551 118/712 |
| 2015/0091075 A1 | 4/2015 | Nishitani et al. | |
| 2015/0155159 A1 | 6/2015 | Igarashi et al. | |
| 2015/0273535 A1 | 10/2015 | Sato et al. | |
| 2015/0330886 A1* | 11/2015 | Ho | B01F 11/0071 356/336 |

FOREIGN PATENT DOCUMENTS

| | | |
|---|---|---|
| JP | 2010-221152 A | 10/2010 |
| JP | 2012-74564 A | 4/2012 |
| JP | 2012-243869 A | 12/2012 |
| JP | 2013-16699 A | 1/2013 |
| JP | 2013-33817 A | 2/2013 |
| JP | 2013-42093 A | 2/2013 |
| JP | 2013-42094 A | 2/2013 |
| JP | 2013-069952 A | 4/2013 |
| JP | 2013-258272 A | 12/2013 |
| JP | 2015-88732 | 5/2015 |
| JP | 2015-106645 A | 6/2015 |
| JP | 2015-185713 | 10/2015 |
| JP | 2016-25233 | 2/2016 |

* cited by examiner

SUBSTRATE TREATMENT APPARATUS AND SUBSTRATE TREATMENT METHOD

CROSS REFERENCE TO RELATED APPLICATIONS

This application is based upon and claims the benefit of priority from the prior Japanese Patent Application No. 2014-232989, filed on Nov. 17, 2014, the entire contents of which are incorporated herein by reference.

FIELD

Embodiments described herein relate generally to a substrate treatment apparatus and a substrate treatment method.

BACKGROUND

In semiconductor processing, a wafer is cleaned with a chemical to keep the wafer clean. After cleaning, the wafer is treated with a rinsing liquid to remove the chemical from the wafer. After treatment with the rinsing liquid, the wafer is dried to transfer the wafer to a subsequent process.

As a technique of drying a wafer, IPA (Iso-Propyl Alcohol) drying is used. In the IPA drying, a wafer is dried through displacement of a surface of the wafer treated with a rinsing liquid with volatile IPA. However, when the IPA drying is applied to a wafer on which a fine line and space patterns having a width of 20 nanometers or a smaller width are formed, collapse or deformation of the line patterns may occur due to surface tension of the IPA placed between line patterns.

To address this problem, there is a drying technique of using organic sublimable materials in a volatile solvent. In this drying technique, the wafer having the rinsing liquid adhering thereto is coated with the organic sublimable material-containing liquid to displace the rinsing liquid with the organic sublimable material-containing liquid. The volatile solvent in the organic sublimable material-containing liquid is then vaporized, thereby depositing the organic sublimable material on the wafer to embed the organic sublimable material in spaces between the convex patterns. Accordingly, the rinsing liquid having adhered onto the wafer is displaced with an organic sublimable film and is completely removed. A surface of the wafer is dried by sublimating the organic film.

However, in the drying technique using the organic sublimable film, if the volatile solvent vaporizes in a short time, the surface of the organic film is partially undulated and the flatness thereof is degraded. If the flatness of the organic film is degraded, the line patterns still may be deformed or collapsed in an area in which the wafer is not covered with the organic film or an area in which the thickness of the organic film is inappropriate.

Some methods of coating concave and convex patterns formed on a surface of a semiconductor substrate with a resist or an organic silicon material and embedding the resist or the organic silicon material in spaces between the patterns are known. For example, there is a method of coating a semiconductor substrate with a solution containing polysilazane and supplying water vapor or ozone gas to a surface of the substrate to convert polysilazane into a silicon dioxide film. There is also a method of, for example, supplying solvent vapor or applying an ultrasound wave to improve embeddability of a coating film. In this method, structure conversion of the film or concavity improvement of the coating film is achieved by supplying the water vapor or the solvent vapor to the coating film. However, because a domed roof is used for a flat substrate, the vapor supply becomes uneven between a central portion of the flat substrate and an outer circumferential portion thereof. Accordingly, an effect of improving the concavity on the coating film at the outer circumferential portion is likely to reduce.

DETAILED DESCRIPTION

A substrate treatment apparatus according to an embodiment comprises a first nozzle, a second nozzle, a detector, and a controller. The first nozzle supplies the liquid containing organic sublimable material which can displace a rinsing liquid, to a surface of a substrate treated with the rinsing liquid. The second nozzle supplies vapor of a solvent in which the organic sublimable material is capable of dissolving, to the surface of the substrate. The detector detects a first physical amount of the vapor on the surface of the substrate. The controller controls a second physical amount of the vapor according to the first physical amount.

Embodiments of the present invention will now be explained with reference to the accompanying drawings. The present invention is not limited to the embodiments.

(First Embodiment)

Figure 1:
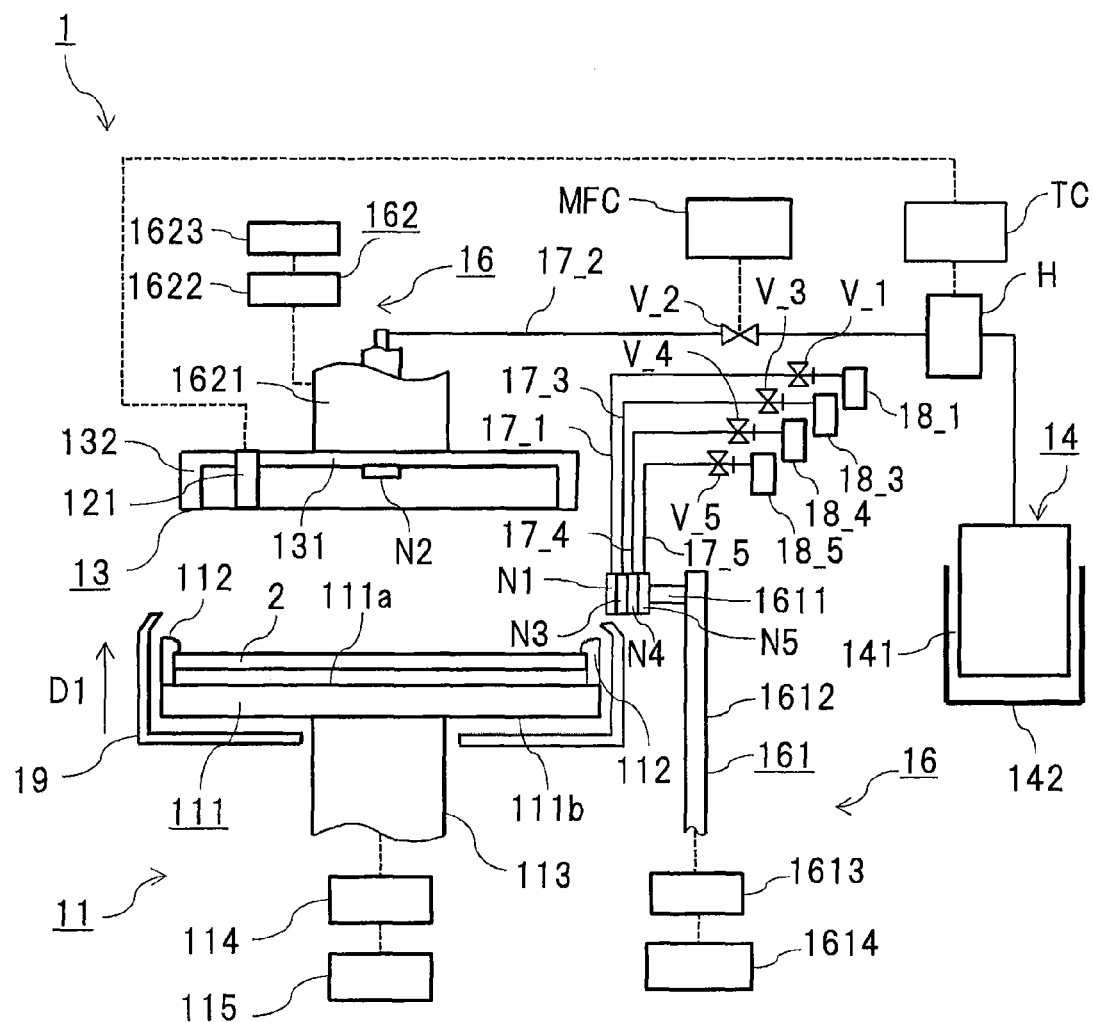
FIG. 1 shows a substrate treatment apparatus 1 according to a first embodiment.

FIG. 1 shows a substrate treatment apparatus 1 according to a first embodiment. The substrate treatment apparatus 1 includes a rotating mechanism 11, a plurality of nozzles N1 to N5, a vapor partial-pressure detector 121, a temperature controller TC, a heater H, a mass flow controller MFC, a facing plate 13, a vapor supply source 14, a vapor supply pipe 17_2, and a moving device 16.

The rotating mechanism 11 has a discoid horizontal stage 111. The stage 111 is fixed to an upper end of a rotating shaft 113 extending vertically and is concentric with the rotating shaft 113. The stage 111 can rotate around the rotating shaft 113. A drive source 114 such as a motor is connected to the rotating shaft 113. The drive source 114 rotationally drives the rotating shaft 113. A controller 115 being constituted by a device such as a driver circuit and a CPU is connected to the drive source 114. The controller 115 controls the rotational drive of the rotating shaft 113 by the drive source 114.

A plurality of chuck pins 112 are arranged on an outer circumferential edge of a surface 111a of the stage 111 circumferentially at spaces. The chuck pins 112 horizontally fix a semiconductor substrate 2 onto the stage 111 to grip an outer circumferential surface of the semiconductor substrate 2. Accordingly, the rotating mechanism 11 can rotate the semiconductor substrate 2 in a state of being fixed above the stage 111.

A substantially tubular cup 19 concentric with the stage 111 is provided around the stage 111. A top end of the cup 19 is located higher than the chuck pins 112. The cup 19 prevents a liquid on a surface of the semiconductor substrate 2 from spattering therearound due to rotation of the rotating mechanism 11, for example, during cleaning, rinsing, and drying explained later.

The first nozzle N1 is connected to a tank 18_1 that stores therein an organic sublimable material-containing liquid via a supply pipe 17_1. A valve V_1 that adjusts the flow rate of the organic sublimable material-containing liquid is arranged on the supply pipe 17_1. The first nozzle N1 moves between a waiting position separated from the semiconductor substrate 2 and a supply position above the surface of the semiconductor substrate 2.

The first nozzle N ejects the organic sublimable material-containing liquid supplied from the tank 18_1 to the surface of the semiconductor substrate 2 treated with a rinsing liquid. The organic sublimable material-containing liquid ejected from the first nozzle N1 is applied to spread from a central portion of the surface of the semiconductor substrate 2 to radially outside with rotation of the semiconductor substrate 2 by the rotating mechanism 11. The organic sublimable material-containing liquid applied on the surface of the semiconductor substrate 2 displaces the rinsing liquid on the surface of the semiconductor substrate 2 and solidifies to form an organic film. The organic film is then sublimated from the semiconductor substrate 2, thereby drying the semiconductor substrate 2.

The organic sublimable material-containing liquid is a solution obtained by dissolving an organic sublimable material solid at an ordinary temperature and an ordinary pressure into a volatile solvent. The organic sublimable material is not particularly limited as long as it forms an organic film. The organic sublimable material is preferably, for example, a low-molecular weight compounds compared to a high-molecular weight compounds and is preferably an aromatic compound or a cyclic compound. More preferably, there are an aromatic compound having a polar functional group and a cyclic compound having a polar functional group. For example, there are a benzoic acid derivative, a phthalic acid derivative, a phenol derivative, a benzophenone derivative, a cyclohexanecarboxylic acid derivative, a benzamide derivative, and an aniline derivative. Alternatively, the organic sublimable material can be a compound having a methyl ester group. The solvent for the organic sublimable material-containing liquid is not particularly limited as long as it can displace the rinsing liquid. For example, when pure water is used as the rinsing liquid, the solvent can be, for example, methanol, ethanol, IPA (that is, 2-propanol), cyclohexanone, acetone, or tetrahydrofuran. Other examples of the solvent can be PGMEA (propylene glycol-1-monomethyle ether acetate) and NMP (N-methylpyrrolidone).

The second nozzle N2 is connected to the vapor supply source 14 via a vapor supply pipe 17_2. The vapor supply source 14 has a solvent tank 141 that stores therein a solvent for the organic sublimable material-containing liquid and a solvent heater 142 that heats the solvent. The solvent heated by the solvent heater 142 vaporizes to become vapor. A vapor supply valve V_2 that adjusts the flow rate of the vapor of the solvent is arranged on the vapor supply pipe 17_2. The mass flow controller MFC is connected to the vapor supply valve V_2. The mass flow controller MFC controls the flow rate of the vapor of the solvent by, for example, controlling the opening degree of the vapor supply valve V_2.

The second nozzle N2 ejects the vapor of the solvent supplied from the vapor supply source 14 to the surface of the semiconductor substrate 2 to which the organic sublimable material-containing liquid has been supplied. In this case, the solvent is, for example, IPA as described above. Because IPA allows the organic sublimable material to be satisfactorily dissolved therein and is high in the displaceability with the rinsing liquid (pure water), IPA is suitable for drying the semiconductor substrate 2.

The solvent of the vapor can be a solvent other than the solvent for the organic sublimable material-containing liquid as long as it allows the organic sublimable material to be dissolved therein. For example, the solvent can be methanol, ethanol, IPA (that is, 2-propanol), cyclohexanone, acetone, tetrahydrofuran, PGMEA (propylene glycol-1-monomethyle ether acetate), or NMP (N-methylpyrrolidone).

An end of the vapor supply pipe 17_2 is connected to the facing plate 13 to be communicated with the second nozzle N2.

The vapor supply source 14 is connected to the other end of the vapor supply pipe 17_2. The second nozzle N2 is arranged at the center of the facing plate 13 that faces the surface of the semiconductor substrate 2. The facing plate 13 has a circular flat top plate 131 that is concentric with the stage 111, and a cylindrical outer circumferential wall 132 that hangs from an outer circumferential end of the top plate 131. The second nozzle N2 can move between a position facing a central portion of the surface of the semiconductor substrate 2 and a position separated from the surface of the semiconductor substrate 2 in an upper direction D1. The second nozzle N2 is moved by the moving device 16 integrally with the facing plate 13.

The vapor of the solvent is supplied onto the semiconductor substrate 2 to soften the organicsublimable material or to reduce the deposition rate of the organic sublimable material. For example, after the organic sublimable material-containing liquid is supplied onto the semiconductor substrate 2, the second nozzle N2 supplies the vapor of the solvent to the organic sublimable material-containing liquid. At this time, the vapor of the solvent delays vaporization of the solvent in the organic sublimable material-containing liquid and also allows the organic sublimable material to be dissolved therein. Accordingly, the organic film keeps a soft state where deposition of the organic sublimable material is imperfect for a relatively long time before the organic sublimable material is completely deposited and becomes a film. That is, the vapor of the solvent reduces (delays) the deposition rate of the organic sublimable material, thereby causing the soft state of the organic film to continue for a relatively long time. The soft organic film has a certain level of fluidity and thus leveling of the organic film is easily achieved through rotation of the semiconductor substrate 2 by the rotating mechanism 11.

The third nozzle N3 is connected to a tank 18_3 that stores therein a rinsing liquid via a supply pipe 17_3. The rinsing liquid is, for example, pure water. A valve V_3 that adjusts the flow rate of the rinsing liquid is arranged on the supply pipe 17_3. The third nozzle N3 can move between the supply position and the waiting position similarly to the first nozzle N1.

The third nozzle N3 discharges the rinsing liquid supplied from the tank 18_3 to the surface of the semiconductor substrate 2 cleaned with a chemical, that is, a cleaning liquid. While the third nozzle N3 supplies the semiconductor substrate 2 with rinsing liquid by a single wafer system, the first embodiment can be also applied to dry the semiconductor substrate 2 rinsed by a batch system. When the semiconductor substrate 2 is to be rinsed by the batch system, it suffices to provide a rinsing liquid bath instead of the third nozzle N3.

The fourth nozzle N4 is connected to a tank 18_4 that stores therein a chemical via a supply pipe 17_4. A valve V_4 that adjusts the flow rate of the chemical is arranged on the supply pipe 17_4. The fourth nozzle N4 ejects the chemical to the surface of the semiconductor substrate 2. The fourth nozzle N4 can move between the supply position and the waiting position similarly to the first nozzle N1. While the fourth nozzle N4 cleans the semiconductor substrate 2 by a single wafer system, the first embodiment can be also applied to dry the semiconductor substrate 2 cleaned by a batch system. When the semiconductor substrate 2 is to be cleaned by the batch system, it suffices to provide a chemical bath instead of the fourth nozzle N4.

The fifth nozzle N5 is connected to a tank 18_5 that stores therein IPA via a supply pipe 17_5. A valve V_5 that adjusts the flow rate of IPA is arranged on the supply pipe 17_5. The fifth nozzle N5 ejects IPA to the surface of the semiconductor substrate 2 treated with the rinsing liquid. IPA can displace the rinsing liquid efficiently. However, as described above, in case that the second nozzle N2 discharges organic sublimable material-containing liquid which can displace the rinsing liquid, the fifth nozzle N5 is not necessarily required.

The vapor partial-pressure detector 121 detects a partial pressure of the vapor of the solvent (hereinafter, also "vapor partial pressure") as a first physical amount of the vapor of the solvent on the substrate surface. The specific mode of the vapor partial-pressure detector 121 is not particularly limited. For example, the vapor partial-pressure detector 121 is a Pirani partial-pressure detector that is exposed to the vapor on an inner side of the outer circumferential wall 132 of the facing plate 13. The Pirani partial-pressure detector has, for example, a metal wire exposed to the vapor and measures a voltage applied to the metal wire and a current flowing through the metal wire, thereby calculating an electrical resistance of the metal wire as the vapor partial pressure. Alternatively, the vapor partial-pressure detector 121 can be a Penning partial-pressure detector (a Penning vacuum gauge) being one type of cold-cathode ionization gauges. The vapor partial-pressure detector 121 outputs a detection value of the vapor partial pressure to the temperature controller TC.

In this case, the vapor partial pressure can be said as one of indices indicating whether drying of the semiconductor substrate 2 is performed appropriately in view of suppression in collapse or deformation of patterns and in view of treatment time. The reason thereof is as follows. If the vapor partial pressure is too low, the solvent vaporizes in a short time and accordingly reduction in the deposition rate of the organic sublimable material becomes difficult. In this case, it is difficult to soften the organic film to such an extent that sufficient leveling can be performed. If the vapor partial pressure is too high, the solvent hardly vaporizes and thus deposition of the organic sublimable material is significantly delayed. Accordingly, the drying time becomes too long. In the first embodiment, the temperature of the vapor affecting the vapor partial pressure is thus controlled using the vapor partial pressure as an index to appropriately achieve drying of the semiconductor substrate 2.

The specific modes of an upper limit and a lower limit of the vapor partial pressure are not particularly limited. For example, the upper limit can be a saturation vapor pressure. The lower limit can be a pressure (50 kilopascals, for example) equal to or lower than the saturation vapor pressure. When the upper limit is the saturation vapor pressure, the vapor partial pressure can be suppressed to a value equal to or lower than the saturation vapor pressure and therefore condensation of the vapor can be suppressed adequately not to significantly delay the deposition of the organic sublimable material. Details of the control are explained later.

The heater H is arranged on the vapor supply pipe 17_2. The heater H heats the vapor supply pipe 17_2 to heat the vapor flowing through the vapor supply pipe 17_2. The temperature controller TC is connected to the vapor partial-pressure detector 121 and the heater H. The temperature controller TC controls the temperature of the heater H to cause the vapor partial pressure to fall within a range between the upper limit and the lower limit according to a value of the vapor partial pressure obtained from the vapor partial-pressure detector 121. The temperature controller TC controls the temperature of the vapor (hereinafter, also "vapor temperature") by controlling the temperature of the heater H. By controlling the vapor temperature, the vapor partial pressure can be controlled to a value appropriate for leveling and prompt drying of the semiconductor substrate 2.

The specific mode of the temperature control on the heater H is not particularly limited. For example, when the heater H has a structure of producing heat with application of an electric signal, the temperature of the heater H can be controlled according to an application amount of the electric signal. It is alternatively possible to arrange a thermometer that detects the vapor temperature on the facing plate 13 or the vapor supply pipe 17_2 and to feed back a detection result of the thermometer to the temperature controller TC. The temperature controller TC can control the vapor temperature to be within a range from 65° C. to 85° C. in such a manner that the vapor partial pressure has a value equal to or lower than the saturation vapor pressure.

The moving device 16 has a first moving device 161 for supplying a liquid agent, and a second moving device 162 for supplying vapor. The moving device 16 moves the nozzles N1 to N5 between the supply position and the waiting position described above. The moving device 16 can move the nozzles N1 and N3 to N5 integrally or individually.

The first moving device 161 has an arm 1611 that has an end coupled to the nozzles N1 and N3 to N5, a rotating shaft 1612 coupled to the other end of the arm 1611, a drive source 1613 that rotationally drives the rotating shaft 1612, and a controller 1614 that controls the drive source 1613.

The second moving device 162 has a support shaft 1621 coupled to the top of the facing plate 13, a drive device 1622 that moves the support shaft 1621 upward and downward, and a controller 1623 that controls the drive device 1622.

If the semiconductor substrate 2 is dried without using the vapor of the solvent, there is a risk that the flatness of the organic film is degraded and the patterns formed on the semiconductor substrate 2 are deformed or collapsed as described above. More specifically, if the vapor of the solvent is not used, the solvent vaporizes in a short time and reduction in the deposition rate of the organic sublimable material is difficult. Therefore, the organic film loses the fluidity and solidifies in a state of being undulated rather than being flat.

Figure 2:
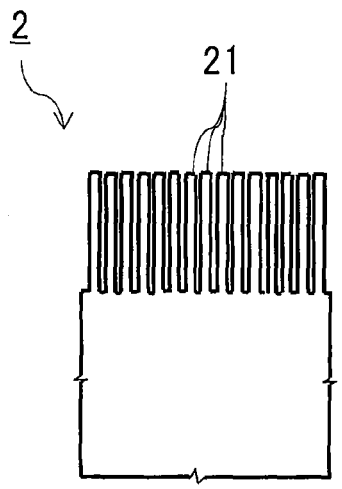
FIG. 2 is a schematic diagram of a semiconductor substrate 2 including line and space patterns 21.

For example, there is a case where a plurality of fine line and space patterns 21 are formed on the surface of the semiconductor substrate 2 at a narrow pitch as shown in FIG. 2. The line and space patterns 21 can be, for example, patterns of memory units in a NAND flash memory or patterns of memory units in a three-dimensionally stacked memory. If the organic film solidifies in an undulated state in a case where the semiconductor substrate 2 having the line and space patterns 21 is dried using the organic sublimable material-containing liquid, the line and space patterns 21 may be deformed or collapsed due to undulation of the organic film. Furthermore, if the solvent of the organic sublimable material-containing liquid vaporizes in a short time, the organic film may solidify before being sufficiently embedded in spaces between the convex patterns 21. Also in this case, the line and space patterns 21 have a risk of being deformed or collapsed.

On the other hand, in the first embodiment, the second nozzle N2 applies the vapor of the solvent to the organic sublimable material-containing liquid supplied onto the semiconductor substrate 2. Accordingly, vaporization of the solvent in the organic sublimable material-containing liquid can be suppressed and the deposition rate of the organic sublimable material can be reduced. Because the solvent of the vapor enables the organic sublimable material deposited in the organic sublimable material-containing liquid or the organic film to be dissolved therein to some extent, the deposition rate of the organic sublimable material can be reduced. In this case, the state where the organic film is soft continues for a relatively long time, which enhances the flatness of the organic film and enables the spaces between the line and space patterns 21 to be appropriately filled. As a result, the substrate treatment apparatus 1 according to the first embodiment can suppress deformation or collapse of patterns.

Furthermore, the vapor of the solvent is supplied in a state where the surface of the semiconductor substrate 2 is covered with the facing plate 13. Accordingly, the vapor of the solvent can be filled in a space between the surface of the semiconductor substrate 2 and the facing plate 13. Vaporization of the solvent in the organic sublimable material-containing liquid thus can be effectively suppressed with a small amount of the solvent vapor. As a result, the deposition rate of the organic sublimable material or the solidification time of the organic film can be reduced more effectively. Because the top plate 131 of the facing plate 13 is parallel to the surface of the semiconductor substrate 2, there is little unevenness in vapor supply between the central portion of the surface of the semiconductor substrate 2 and the outer circumferential portion thereof. As a result, the deposition rate of the organic sublimable material can be effectively reduced over the entire surface of the semiconductor substrate 2.

If the vapor of the solvent is heated at a constant temperature or at preset temperatures changing in a stepwise manner, it is difficult to appropriately dry the semiconductor substrate 2. This is because the constant temperature or the preset temperatures changing in a stepwise manner do not reflect any actual vapor partial pressure.

On the other hand, because the vapor temperature can be changed according to a monitoring result of the vapor partial pressure in the first embodiment, the vapor temperature can be changed according to an actual vapor partial pressure. Accordingly, the deposition rate of the organic sublimable material or the solidification time of the organic film can be appropriately controlled. As a result, the semiconductor substrate 2 can be dried in a short time while deformation or collapse of patterns is suppressed.

At portions of the surface of the semiconductor substrate near the chuck pins 112, the flow of the organic sublimable material-containing liquid is likely to be interfered by the chuck pins 112. Accordingly, coating unevenness of the organic sublimable material-containing liquid is likely to occur near the chuck pins 112. However, according to the first embodiment, with use of the solvent vapor, a state where the organic sublimable material-containing liquid near the chuck pins 112 is soft continues for a relatively long time. Therefore, the coating unevenness near the chuck pins 112 can be suppressed. This enables also the organic film near the chuck pins 112 to be sufficiently flattened and deformation or collapse of patterns near the chuck pins 112 can be also suppressed.

As described above, the substrate treatment apparatus 1 according to the first embodiment can control the vapor pressure of the solvent on the substrate surface and correspondingly can control vaporization of the solvent from the organic sublimable material-containing liquid. By controlling vaporization of the solvent, the embeddability of the deposited organic sublimable material (that is, the organic film) and the film thickness thereof are improved and collapse or deformation of patterns can be suppressed.

Figure 3:
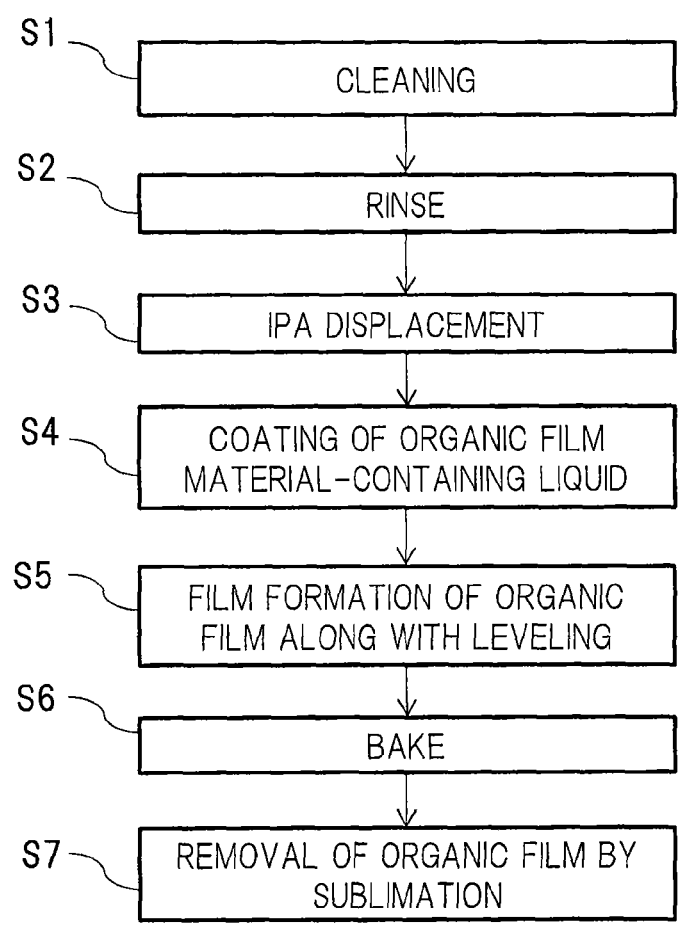
FIG. 3 is an overall process chart of a substrate treatment method according to the first embodiment.
Figure 4:
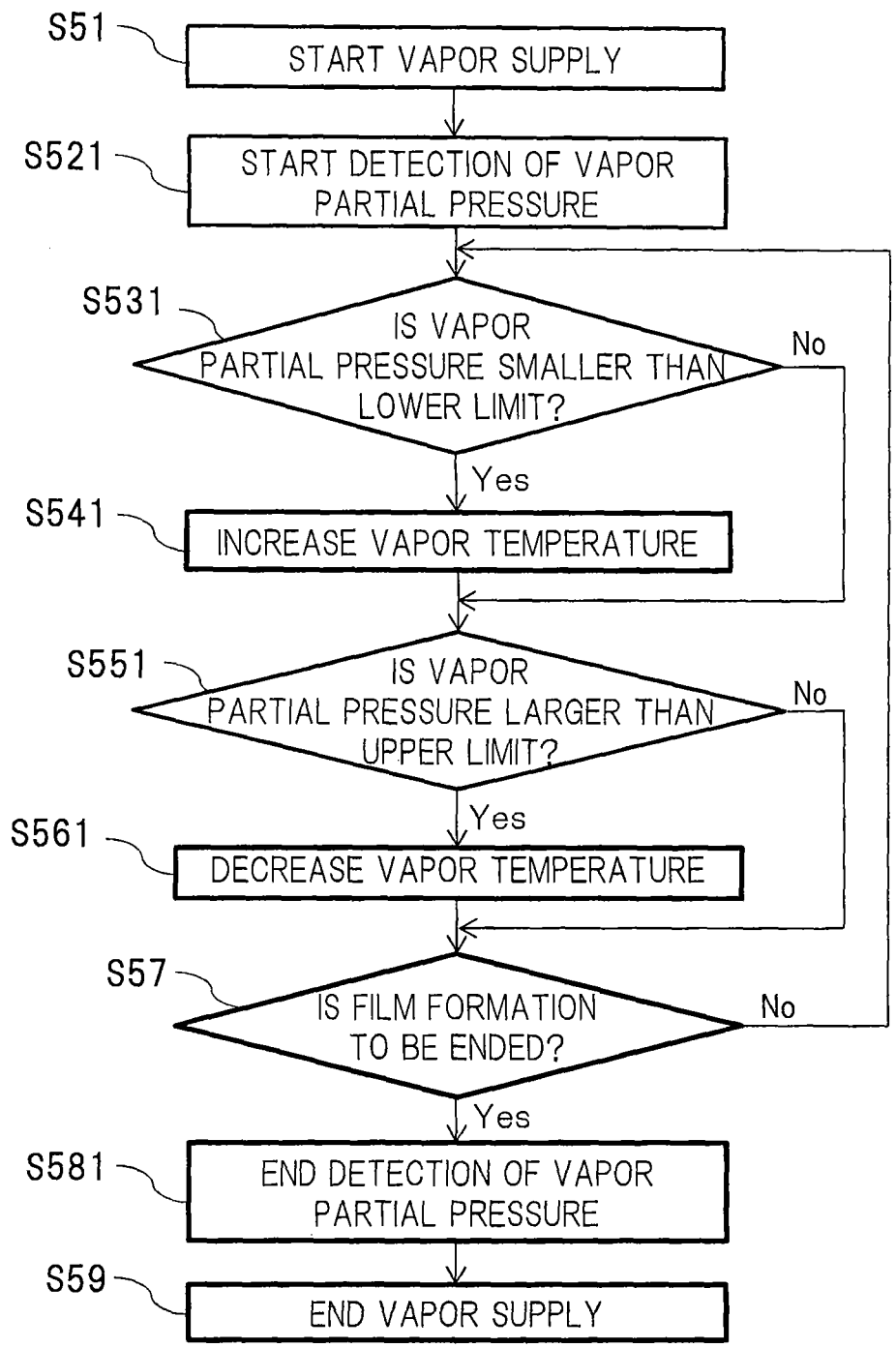
FIG. 4 is a film-formation process chart of the substrate treatment method according to the first embodiment.
Figure 5:
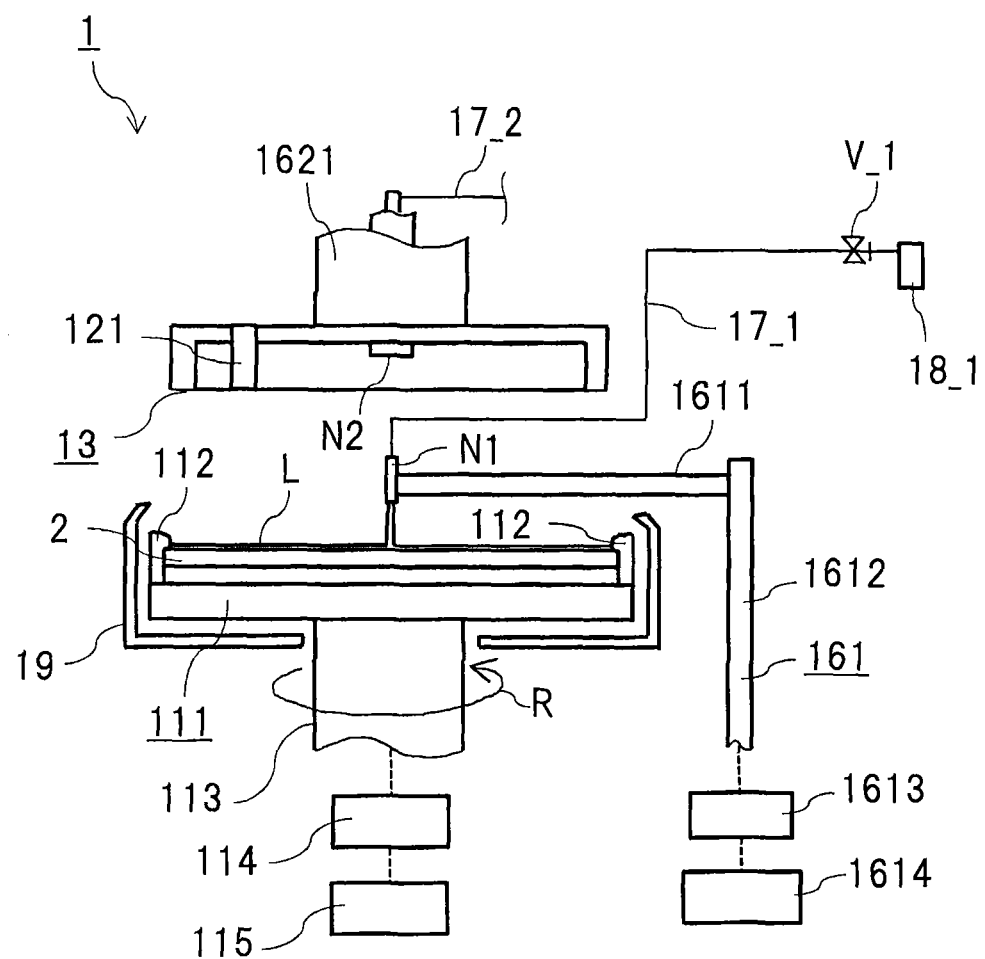
FIG. 5 shows an operation of coating an organic sublimable material-containing liquid of the substrate treatment apparatus 1 shown in FIG. 1.
Figure 6:
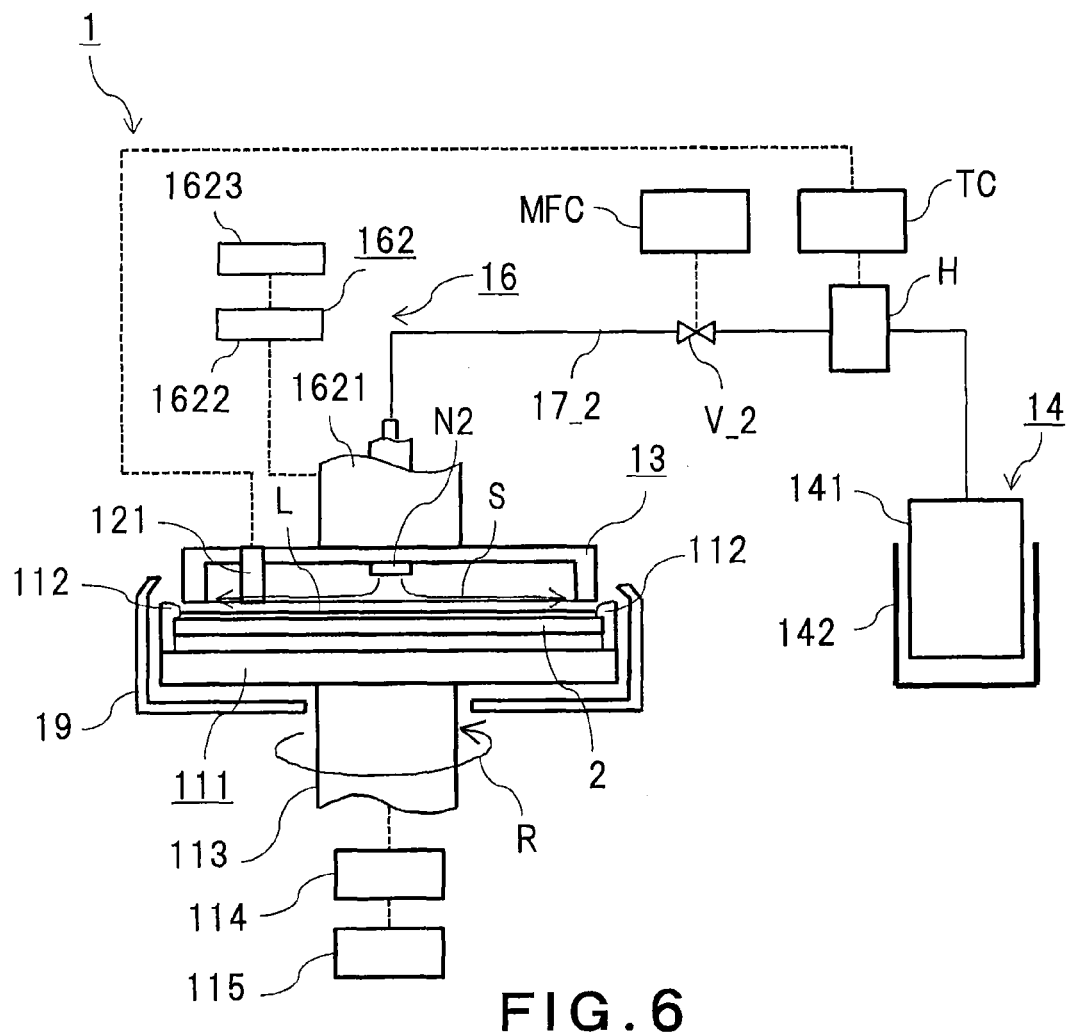
FIG. 6 shows a vapor supply operation of the substrate treatment apparatus 1 shown in FIG. 1.

An operation example of the substrate treatment apparatus 1 as an example of a substrate treatment method according to the first embodiment is explained next with reference to FIGS. 3 to 7. FIG. 3 is an overall process chart of the substrate treatment method according to the first embodiment. FIG. 4 is a film-formation process chart of the substrate treatment method according to the first embodiment. FIG. 5 shows an operation of coating the organic sublimable material-containing liquid of the substrate treatment apparatus 1 shown in FIG. 1. FIG. 6 shows a vapor supply operation of the substrate treatment apparatus 1 shown in FIG. 1.

First, at Step S1 in FIG. 3, the substrate treatment apparatus 1 performs a cleaning process for the semiconductor substrate 2 placed on the stage 111. In the cleaning process, the first moving device 161 moves the fourth nozzle N4 to the supply position to eject the chemical to the surface of the semiconductor substrate 2. At this time, the drive source 114 rotates the stage 111. With rotation of the stage 111, the semiconductor substrate 2 is cleaned while rotating.

Next, at Step S2, the substrate treatment apparatus 1 performs a rinse process for the cleaned semiconductor substrate 2 to displace the rinsing liquid for the chemical (that is, a cleaning liquid) on the surface of the semiconductor substrate 2. In the rinse process, the first moving device 161 moves the third nozzle N3 to the supply position to eject the rinsing liquid to the surface of the semiconductor substrate 2. At this time, the drive source 114 rotates the stage 111. With rotation of the stage 111, the semiconductor substrate 2 is rinsed while rotating.

Subsequently, the substrate treatment apparatus 1 performs an IPA displacement process for the rinsed semiconductor substrate 2 at Step S3. In the IPA displacement process, the first moving device 161 moves the fifth nozzle N5 to the supply position to eject IPA to the substrate surface. At this time, the drive source 114 rotates the stage 111. With rotation of the stage 111, IPA displaces the rinsing liquid while the semiconductor substrate 2 is rotating. When the organic sublimable material-containing liquid can sufficiently displace the rinsing liquid, the IPA displacement process can be omitted. The vapor of IPA from the second nozzle N2 instead of the fifth nozzle N5 can be alternatively used to perform the IPA displacement process.

Next, at Step S4, the substrate treatment apparatus 1 performs a process of coating the semiconductor substrate 2 after the IPA displacement with the organic sublimable material-containing liquid. In the coating process, the first moving device 161 moves the first nozzle N1 to the supply position to eject the organic sublimable material-containing liquid (reference character L in FIG. 5) to the surface of the semiconductor substrate 2. In FIG. 5, the first nozzle N1 moved to the supply position is shown. At this time, the drive source 114 rotates the stage 111 around the rotating shaft 113 denoted by reference character R in FIG. 5. With rotation of the stage 111, the substrate surface is coated with the organic sublimable material-containing liquid L from the central portion of the substrate surface to radially outside. Accordingly, the rinsing liquid remaining on the substrate surface is efficiently displaced by the organic sublimable material-containing liquid L. Therefore, the coating process is also a process of displacing the organic sublimable material-containing liquid for the rinsing liquid on the substrate surface. After the coating process ends, the first moving device 161 moves the nozzles N1 and N3 to N5 to the waiting position.

Next, at Step S5, the substrate treatment apparatus 1 performs a film forming process of the organic film, that is, a process of depositing the organic sublimable material while supplying the vapor of the solvent for the organic sublimable material-containing liquid to the semiconductor substrate 2 coated with the organic sublimable material-containing liquid L. In the film forming process, the second moving device 162 moves the second nozzle N2 to the supply position to supply the solvent vapor (reference character S in FIG. 6) to the organic sublimable material-containing liquid L on the surface of the semiconductor substrate 2. At this time, the facing plate 13 covers the surface of the semiconductor substrate 2 from above. In FIG. 6, the second nozzle N2 moved to the supply position is shown. At this time, the drive source 114 rotates the stage 111 faster than in the coating process (S4).

With supply of the vapor S, the organic sublimable material is not rapidly deposited but is deposited over a certain period of time on the surface of the semiconductor substrate 2. Accordingly, a soft and elastic (flexible) organic film is gradually formed on the surface of the semiconductor substrate 2. Such an organic film can be said as a semisolid film or a viscous film (such as a gel-like film) having a certain viscosity between a liquid and a solid. When a large centrifugal force acts on such an organic film due to high-speed rotation of the stage 111, the organic film flows to radially outside on the surface of the semiconductor substrate 2. Accordingly, the surface of the organic film is leveled and differences in levels (undulation) on the surface of the semiconductor substrate 2 can be reduced. The leveling is enhanced in this way.

Furthermore, when a solid organic film is already formed on the surface of the semiconductor substrate 2, the vapor of the solvent can soften the solid organic film again. Therefore, even when the solid organic film is already formed, the organic film can be leveled.

Figure 7:
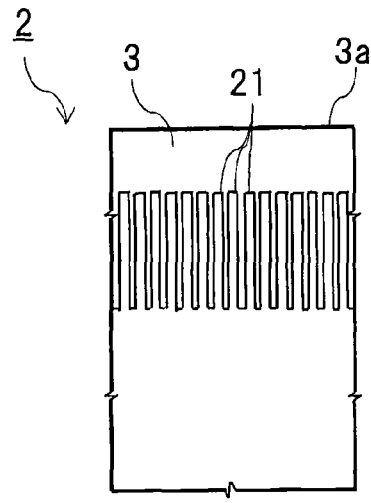
FIG. 7 is a schematic diagram of the semiconductor substrate 2 in which an organic film 3 is formed.

Further, because the organic sublimable material is not rapidly deposited but is deposited over a certain period of time, the organic sublimable material can be sufficiently embedded in spaces between the convex patterns 21 as shown in FIG. 7.

Further, the solvent remains in a soft organic film. Therefore, the rinsing liquid remaining in the spaces between the convex patterns 21 can be displaced by the solvent in the organic film. This further enhances the leveling. By then stopping supply of the vapor of the solvent, the solvent vaporizes from the organic film and the organic film solidifies.

Subsequently, at Step S6, a bake process using a baking furnace (not shown) is performed for the semiconductor substrate 2 having the organic film formed thereon. Next, at Step S7, a process of sublimating the organic film is performed for the baked semiconductor substrate 2 using a sublimation device (not shown). In the sublimation process, the temperature and the pressure of the organic film are adjusted, thereby transitioning the organic film, that is, the deposited organic sublimable material directly into a gas phase to be removed from the substrate surface. The organic film can be removed by being vaporized using plasma. Drying of the semiconductor substrate 2 is thereby completed.

(Film Forming Process of Organic Film)

More details of the film forming process (S5) are explained next with reference to FIG. 4. In the film forming process, first, the second nozzle N2 starts supply of the vapor S at Step S51.

Next, the vapor partial-pressure detector 121 starts detection of a vapor partial pressure at Step S521.

Subsequently, at Step S531, the temperature controller TC determines whether the vapor partial pressure detected at Step S521 is lower than the lower limit. When the vapor partial pressure is lower than the lower limit (YES at Step S531), the process proceeds to Step S541. On the other hand, when the vapor partial pressure is equal to or higher than the lower limit (NO at Step S531), the process proceeds to Step S551.

When the process proceeds to Step S541, the temperature controller TC increases the vapor temperature. After Step S541, the process proceeds to Step S551.

At Step S541, the temperature controller TC, for example, can repeat increasing of the vapor temperature by a certain value plural times until a vapor partial pressure equal to or higher than the lower limit is detected. Alternatively, for example, when a correspondence relation between vapor partial pressures and preferable increasing amounts of the vapor temperature is preset by a mode such as a table or a function, the temperature controller TC can select a preferable increasing amount of the vapor temperature based on the correspondence relation.

Next, at Step S551, the temperature controller TC determines whether the vapor partial pressure detected at Step S521 is higher than the upper limit. When the vapor partial pressure is higher than the upper limit (YES at Step S551), the process proceeds to Step S561. On the other hand, when the vapor partial pressure is equal to or lower than the upper limit (NO at Step S551), the process proceeds to Step S57.

When the process proceeds to Step S561, the temperature controller TC decreases the vapor temperature. After Step S561, the process proceeds to Step S57.

At Step S561, the temperature controller TC, for example, can stop drive of the heater H until a vapor partial pressure equal to or lower than the upper limit is detected. Alternatively, the temperature controller TC can decrease gradually or in a stepwise manner the heating temperature of the heater H until a vapor pressure equal to or lower than the upper limit is detected.

Subsequently, at Step S57, the substrate treatment apparatus 1 determines whether to end the film formation. This determination can be performed, for example, using passage of a preset time from a start time of the vapor supply as a criterion. When a film formation end is detected (YES at Step S57), the process proceeds to Step S581. When a film formation end is not detected (NO at Step S57), the process returns to Step S531.

Next, at Step S581, the vapor partial-pressure detector 121 ends the detection of the vapor partial pressure.

Subsequently, at Step S59, the second nozzle N2 ends the supply of the vapor S. The process then proceeds to Step S6 in FIG. 3.

According to the film forming process described above, the vapor temperature can be changed to cause the vapor partial pressure to fall within a range between the upper limit and the lower limit according to a monitoring result of the vapor partial pressure. Therefore, the deposition rate of the organic sublimable material can be controlled. The semiconductor substrate 2 thus can be dried in as short a time as possible while deformation or collapse of patterns is suppressed.

According to the first embodiment, with supply of the vapor S, a soft and elastic (flexible) organic film is gradually formed on the surface of the semiconductor substrate 2. By rotating the semiconductor substrate 2 having such an organic film, the organic film on the surface of the semiconductor substrate 2 can be leveled.

Furthermore, when a solid organic film is already formed on the surface of the semiconductor substrate 2, the vapor of the solvent can soften the solid organic film again. Therefore, even when a solid organic film is already formed, the organic film can be leveled.

Further, because the organic sublimable material is not rapidly deposited but is deposited over a certain period of time, the organic sublimable material can be embedded sufficiently in the spaces between the convex patterns 21.

(Modification)

In the first embodiment, an example in which the semiconductor substrate 2 is dried using a solution obtained by dissolving an organic sublimable material in a solvent as the organic sublimable material-containing liquid is explained. However, the organic sublimable material-containing liquid can be a melted organic sublimable material itself. The melted organic sublimable material does not contain any solvent. The melted organic sublimable material solidifies, thereby forming an organic film.

Even when the melted organic sublimable material is used as the organic sublimable material-containing liquid in the film forming process described above, the vapor of the solvent allows the organic sublimable material to be dissolved therein and can bring the organic sublimable material-containing liquid to a semisolid or a viscous body. Accordingly, the present modification can achieve effects identical to those of the first embodiment.

(Second Embodiment)

A second embodiment is explained next. In the explanations of the second embodiment, constituent elements corresponding to those in the first embodiment are denoted by like reference characters and redundant explanations thereof will be omitted.

Figure 8:
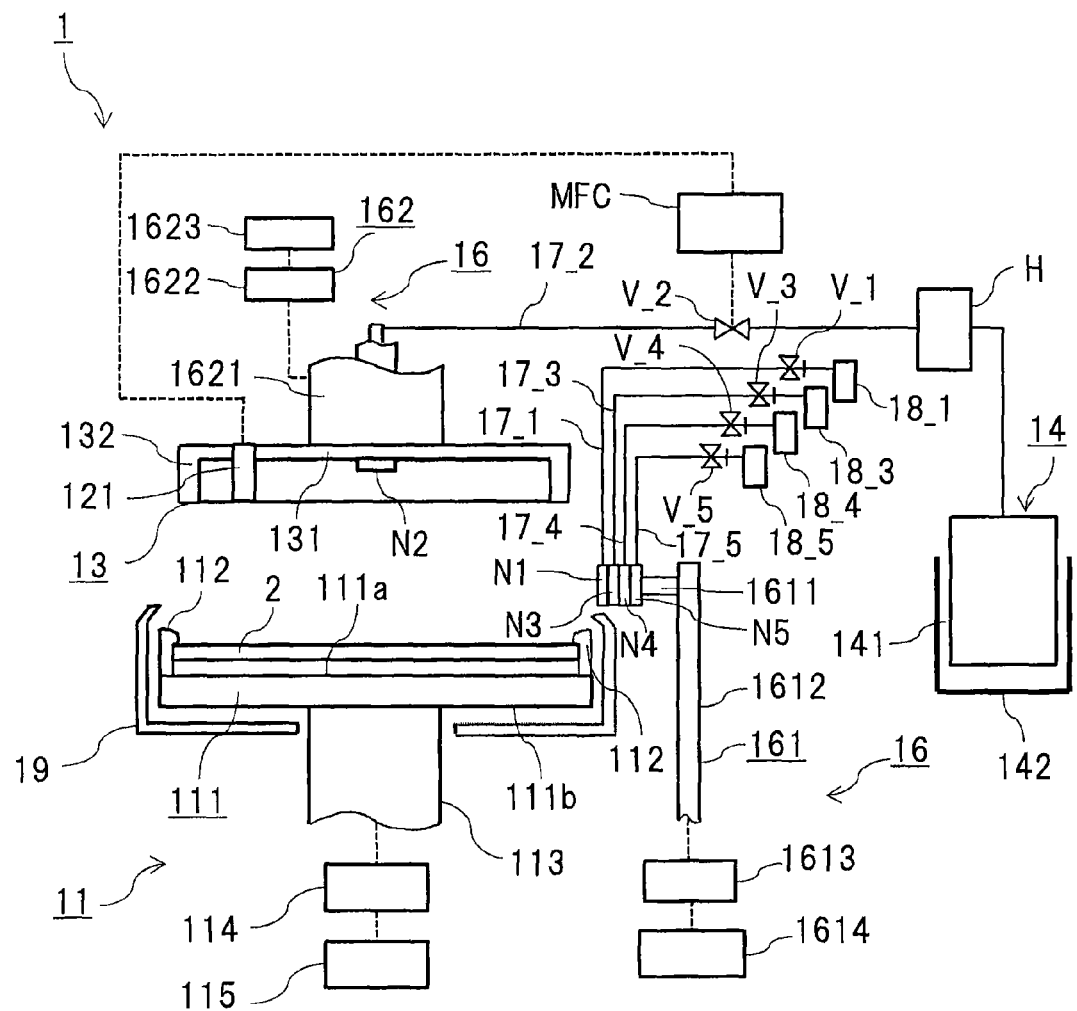
FIG. 8 shows the substrate treatment apparatus 1 according to a second embodiment.

FIG. 8 shows the substrate treatment apparatus 1 according to a second embodiment. The substrate treatment apparatus 1 according to the second embodiment has a vapor concentration detector 122 instead of the vapor partial-pressure detector 121 explained in the first embodiment.

The vapor concentration detector 122 detects a concentration of the vapor of the solvent (hereinafter, also "vapor concentration") on the substrate surface as the first physical amount of the vapor of the solvent on the substrate surface. The specific mode of the vapor concentration detector 122 is not particularly limited. The vapor concentration detector 122 is, for example, an infrared-absorption concentration detector arranged on the facing plate 13. For example, the infrared-absorption concentration detector irradiates infrared light from a light source to the vapor of the solvent inside the outer circumferential wall 132 of the facing plate 13, receives infrared light not having been absorbed by the vapor but having transmitted therethrough with a photoreceiver, and calculates a vapor concentration corresponding to the amount of received light. Alternatively, the vapor concentration detector 122 can be a hydrogen flame ionization detector (FID). For example, the FID collects ions obtained by burning the vapor of the solvent in a hydrogen flame with a collector electrode and converts the collected ions into an electric signal, thereby calculating a vapor concentration corresponding to the electric signal. Alternatively, the vapor concentration detector 122 can be a photoionization concentration detector (ND). The PID detects, for example, VOCs in the vapor of the solvent ionized by light irradiation as a charge amount using an electrode, thereby calculating a vapor concentration corresponding to the charge amount. The vapor concentration detector 122 outputs a detection value of the vapor concentration to the mass flow controller MFC.

In this case, the vapor concentration can be said as one of indices indicating whether drying of the semiconductor substrate 2 is performed appropriately in view of suppression in collapse or deformation of patterns and in view of treatment time. The reason thereof is as follows. If the vapor concentration is too low, it is difficult to reduce the deposition rate of the organic sublimable material and therefore it is difficult to soften the organic film to such an extent that sufficient leveling can be performed. If the vapor concentration is too high, the deposition of the organic sublimable material is significantly delayed, which causes the drying time to become too long. In the second embodiment, the flow rate of the vapor that affects the vapor concentration is controlled using the vapor concentration as an index to appropriately achieve drying of the semiconductor substrate 2. Details of the control are explained later.

The mass flow controller MFC in the second embodiment is connected to the vapor concentration detector 122. The mass flow controller MFC controls the opening degree of the vapor supply valve V_2 according to the vapor concentration obtained from the vapor concentration detector 122 to cause the vapor concentration to fall within a range between an upper limit and a lower limit. The mass flow controller MFC controls the flow rate of the vapor of the solvent (hereinafter, also "vapor flow rate") by controlling the opening degree of the vapor supply valve V_2. The specific mode of the control on the opening degree of the vapor supply valve V_2 is not particularly limited. For example, when the vapor supply valve V_2 has a structure in which the opening degree changes with application of an electric signal, the opening degree can be controlled according to an application amount of the electric signal.

In the second embodiment, the vapor flow rate can be changed according to a monitoring result of the vapor concentration. In this case, the vapor flow rate can be changed according to an actual vapor concentration and thus the deposition rate of the organic sublimable material or the solidification time of the organic film can be appropriately controlled. Accordingly, the semiconductor substrate 2 can be dried in a short time while deformation or collapse of patterns is suppressed.

Figure 9:
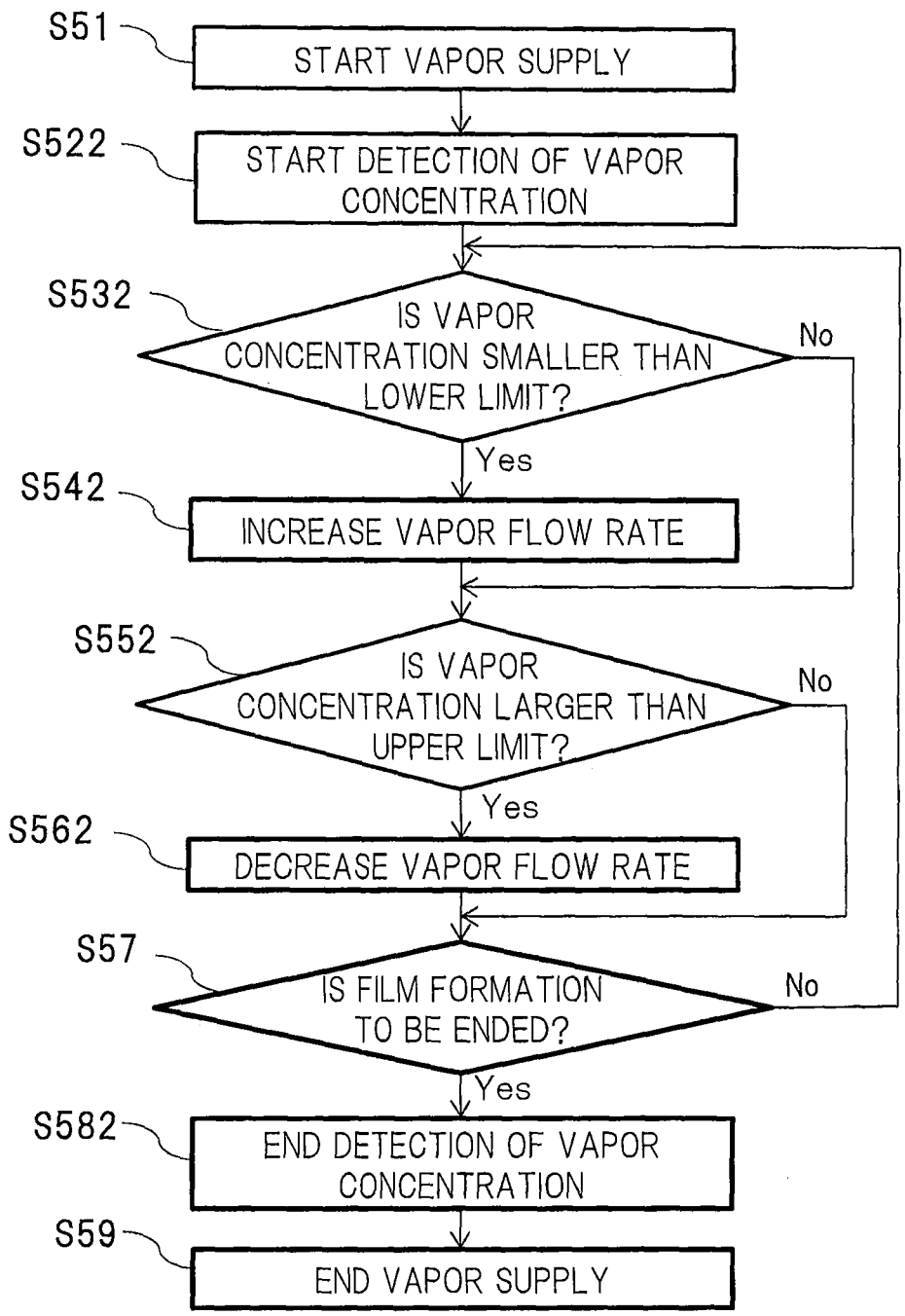
FIG. 9 is a film-formation process chart of a substrate treatment method according to the second embodiment.

An operation example of the substrate treatment apparatus 1 as an example of a substrate treatment method according to the second embodiment is explained next with reference to FIG. 9. FIG. 9 is a film-formation process chart of the substrate treatment method according to the second embodiment.

As shown in FIG. 9, Steps S522 to S562 and S582 are performed in the second embodiment instead of Steps S521 to S561 and S581 in FIG. 4.

At Step S522, the vapor concentration detector 122 starts detection of a vapor concentration.

At Step S532, the mass flow controller MFC determines whether the vapor concentration detected at Step S522 is lower than the lower limit. When the vapor concentration is lower than the lower limit (YES at Step S532), the process proceeds to Step S542. On the other hand, when the vapor concentration is equal to or higher than the lower limit (NO at Step S532), the process proceeds to Step S552.

When the process proceeds to Step S542, the mass flow controller MFC increases the vapor flow rate. After Step S542, the process proceeds to Step S552.

At Step S542, the mass flow controller MFC, for example, can repeat increasing of the vapor flow rate by a certain value plural times until a vapor concentration equal to or higher than the lower limit is detected. For example, when a correspondence relation between vapor concentrations and preferable increasing amounts of the vapor flow rate is preset by a mode such as a table or a function, the mass flow controller MFC can select a preferable increasing amount of the vapor flow rate based on the correspondence relation.

At Step S552, the mass flow controller MFC determines whether the vapor concentration detected at Step S522 is higher than the upper limit. When the vapor concentration is higher than the upper limit (YES at Step S552), the process proceeds to Step S562. On the other hand, when the vapor concentration is equal to or lower than the upper limit (NO at Step S552), the process proceeds to Step S57.

When the process proceeds to Step S562, the mass flow controller MFC decreases the vapor flow rate. After Step S562, the process proceeds to Step S57.

At Step S562, for example, the mass flow controller MFC can repeat a decreasing control on the vapor flow rate by a certain value plural times until a vapor concentration equal to or lower than the upper limit is detected. For example, when information of preferable decreasing amounts of the vapor flow rate corresponding to vapor concentrations is previously obtained from a mode such as a table or a function, the mass flow controller MFC can select a preferable decreasing amount based on the information.

At Step S582, the vapor concentration detector 122 ends the detection of the vapor concentration.

Other configurations and operational effects of the second embodiment can be identical to those of the first embodiment.

In the first and second embodiments, the vapor of the solvent can be supplied during coating of the organic sublimable material-containing liquid. In this case, to simultaneously perform coating of the organic sublimable material-containing liquid and supply of the vapor, the first nozzle N1 can be provided on the facing plate 13 together with the second nozzle N2. Furthermore, the vapor of the solvent can be supplied after solidification of the organic film. In this case, the organic film is dissolved and softened to level the organic film.

The first embodiment and the second embodiment can be combined as appropriate. For example, one or both of the vapor temperature and the vapor flow rate can be controlled according to one or both of monitoring results of the vapor partial pressure and the vapor concentration. In the second embodiment, a melted organic sublimable material can be also used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
a first nozzle supplying an organic sublimable material-containing liquid capable of displacing a rinsing liquid, to a surface of a substrate treated with the rinsing liquid;
a second nozzle supplying vapor of a solvent in which the organic sublimable material is capable of dissolving, to the surface of the substrate;
a detector detecting a first physical amount of the vapor on the surface of the substrate, the first physical amount comprising a concentration;
a controller controlling a second physical amount of the vapor according to the first physical amount, the second physical amount comprising a flow rate;
a vapor supply pipe communicated with the second nozzle;
a vapor supply source connected to the vapor supply pipe; and
a vapor supply valve located on the vapor supply pipe; wherein
the controller comprises a mass flow controller located on the vapor supply pipe, and
the mass flow controller controls the flow rate of the vapor by controlling the opening degree of the vapor supply valve according to the concentration obtained from the detector to cause the concentration to fall within a range between an upper limit and a lower limit.

2. The apparatus of Claim 1, wherein the first physical amount comprises a partial pressure.

3. The apparatus of claim 1, wherein the second physical amount comprises a temperature.

4. The apparatus of claim 1, further comprising a facing plate facing the surface of the substrate.

5. The apparatus of claim 4, wherein the second nozzle is located at a center of the facing plate, and
the vapor supply pipe is connected to the facing plate.

6. The apparatus of claim 1, further comprising a moving device selectively moving the first nozzle and the second nozzle to a position facing the surface of the substrate.

7. The apparatus of claim 5, wherein
the second physical amount comprises a temperature,
the substrate treatment apparatus comprises a heater heating the vapor supply pipe, and
the controller controls the heater.

8. The apparatus of claim 1, wherein
the first physical amount comprises a partial pressure, and
the detector comprises at least one of a Pirani partial-pressure detector and a Penning partial-pressure detector.

9. The apparatus of claim 1, wherein
the detector comprises at least one of an infrared-absorption concentration detector, an optical-absorption concentration detector, a hydrogen flame ionization VOC spectrometer (FID), and a photoionization concentration detector (PID).

10. The apparatus of claim 1, wherein the organic sublimable material-containing liquid comprises at least one of the organic sublimable material melted and a solution having the organic sublimable material dissolved therein.

11. The apparatus of claim 10, wherein
   the organic sublimable material comprises at least one of a hydroxyl group, a carboxyl group, an amino group, an amide group, and a methyl ester group, and
   a solvent of a solution having the organic sublimable material dissolved therein comprises at least one of methanol, ethanol, 2-propanol, cyclohexanone, acetone, tetrahydrofuran, PGMEA (propylene glycol-1-monomethyle ether acetate), and NWP (N-methyl-pyrrolidone).

12. The apparatus of claim 1, further comprising a third nozzle supplying the rinsing liquid to the surface of the substrate.

13. The apparatus of claim 1, further comprising a rotating mechanism rotating the substrate in a state of being kept horizontally.

14. The apparatus of claim 13, wherein the rotating mechanism comprises chuck pins holding the substrate horizontally.

* * * * *